United States Patent
Kobayashi et al.

(10) Patent No.: US 8,592,686 B2
(45) Date of Patent: Nov. 26, 2013

(54) PRINTED CIRCUIT BOARD ASSEMBLED PANEL, UNIT SHEET FOR PACKAGING A PRINTED CIRCUIT BOARD, RIGID-FLEXIBLE BOARD AND METHOD FOR MANUFACTURING THE SAME

(75) Inventors: Atsushi Kobayashi, Tokyo (JP); Kazuo Umeda, Tokyo (JP); Wataru Gotou, Tokyo (JP); Takahiro Sahara, Tokyo (JP); Susumu Nakazawa, Tokyo (JP); Kiyoshi Takeuchi, Tokyo (JP); Takayuki Terauchi, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 957 days.

(21) Appl. No.: 11/547,715

(22) PCT Filed: Apr. 4, 2005

(86) PCT No.: PCT/JP2005/006593
§ 371 (c)(1),
(2), (4) Date: Sep. 29, 2008

(87) PCT Pub. No.: WO2005/099324
PCT Pub. Date: Oct. 20, 2005

(65) Prior Publication Data
US 2009/0014205 A1  Jan. 15, 2009

(30) Foreign Application Priority Data

Apr. 9, 2004  (JP) ................ P2004-116275
Nov. 30, 2004  (JP) ................ P2004-347175

(51) Int. Cl.
*H05K 1/00* (2006.01)

(52) U.S. Cl.
USPC .......... 174/254; 361/749; 361/750; 361/751; 361/756; 174/255; 174/262

(58) Field of Classification Search
USPC .................. 361/749, 750, 751, 756
See application file for complete search history.

(56) References Cited

U.S. PATENT DOCUMENTS 3,471,348 A * 10/1969 Iles et al. ............ 216/18
5,072,074 A * 12/1991 DeMaso et al. ........... 174/254
5,206,463 A * 4/1993 DeMaso et al. ........... 174/254

(Continued)

FOREIGN PATENT DOCUMENTS

JP  63-64075   4/1988
JP  2-74092    3/1990

(Continued)

OTHER PUBLICATIONS

JP H11-054927 English translation.*

(Continued)

*Primary Examiner* — Tuan T Dinh
*Assistant Examiner* — Steven Sawyer
(74) *Attorney, Agent, or Firm* — Finnegan, Henderson, Farabow, Garrett & Dunner, L.L.P.

(57) ABSTRACT

A method for manufacturing a printed circuit board assembled panel by a simple process with an excellent material yield and a high conforming product rate. Unit printed circuit boards previously manufactured are arranged in a frame in a prescribed relationship. Then, the printed circuit boards are fixed to one another, and the printed circuit board and the frame body are fixed to one another.

6 Claims, 14 Drawing Sheets

(56) References Cited

U.S. PATENT DOCUMENTS

| | | | |
|---|---|---|---|
| 5,219,292 A * | 6/1993 | Dickirson et al. | 439/67 |
| 5,600,103 A * | 2/1997 | Odaira et al. | 174/265 |
| 5,615,088 A * | 3/1997 | Mizumo | 361/749 |
| 6,175,087 B1 | 1/2001 | Keesler et al. | |
| 2002/0144775 A1 | 10/2002 | Tung et al. | |

FOREIGN PATENT DOCUMENTS

| | | |
|---|---|---|
| JP | 5-75270 | 3/1993 |
| JP | 8-204332 | 8/1996 |
| JP | 8-335759 | 12/1996 |
| JP | 11-54927 | 2/1999 |
| JP | 2001-24292 | 1/2001 |
| JP | 2002-299828 | 10/2002 |
| JP | 2002-353572 | 12/2002 |
| JP | 2003-69190 | 3/2003 |
| JP | 2003-110204 | 4/2003 |
| JP | 2003-229656 | 8/2003 |
| JP | 2003-258393 | 9/2003 |
| JP | 2004-63710 | 2/2004 |
| JP | 2004-87786 | 3/2004 |
| TW | 428423 | 4/2001 |
| TW | 513901 | 12/2002 |

OTHER PUBLICATIONS

Office Action issued by the Taiwanese Patent Office on Jan. 28, 2011, for Taiwanese Patent Application No. 094111251, and English-language Summary thereof.

International Preliminary Report on Patentability issued by the International Bureau of WIPO on Mar. 1, 2007.

Office Action issued by the Korean Patent Office on Mar. 24, 2011, for Korean Patent Application No. 10-2006-7023367, and English-language summary thereof.

Office Action issued by the Japanese Patent Office on Aug. 31, 2010, for Japanese Patent Application No. 2004-347175, and English-language Summary thereof.

Office Action issued by the Chinese Patent Office on Oct. 16, 2009, for Chinese Patent Application No. 200580010682.3, and English-language translation thereof.

International Search Report on Patentability issued by the Japanese Patent Office on Jul. 19, 2005, for International Application No. PCT/JP2005/006593.

* cited by examiner

PRINTED CIRCUIT BOARD ASSEMBLED PANEL, UNIT SHEET FOR PACKAGING A PRINTED CIRCUIT BOARD, RIGID-FLEXIBLE BOARD AND METHOD FOR MANUFACTURING THE SAME

TECHNICAL FIELD

The present invention relates to a printed circuit board assembled panel, a unit sheet for packaging a printed circuit board, a rigid-flexible board and a method for manufacturing the same, particularly to a printed circuit board assembled panel and a unit sheet for package whereby the intended rigid-flexible board which is made by combining the rigid board and the flexible board can be formed under the condition of lower material loss and high productive efficiency and to a method for manufacturing the same.

BACKGROUND ART

In disposing a rigid board over a bending portion of a steel case of an electronic instrument, generally, the rigid board is divided into a plurality of pieces which are to be connected with one another by utilizing a flexible board.

Such a rigid-flexible board can be made as a printed circuit board as follows. In this case, a plurality of rigid-flexible board can be obtained from the printed circuit board.

(1) A rigid board is formed so as to comprise a plurality of unit flexible boards, a plurality of circuit patterns, each being provided on the corresponding unit flexible board, and a plurality of circuit patterns, each being provided at the corresponding unit rigid board as an inner plate.

(2) A rigid board is formed so as to compose a cupper layer on the top surface or the bottom surface thereof which is to be contacted to the flexible board so that the rigid board is laminated with the flexible board. The portion of the rigid board corresponding to the unit flexible board is punched out.

(3) The rigid board formed in the step (1) is laminated on the flexible board formed in the step (2) at the main surface of the flexible board under the condition that a releasing film and a cover film are formed at the punched out portion of the rigid board. Then, the rigid board and the flexible board are combined with one another through thermal pressing.

(4) The rigid board is laminated on the flexible board at the backside of the flexible board under the condition that a releasing film and a cover film are formed at the punched out portion of the rigid board. Then, the rigid board and the flexible board are combined with one another through thermal pressing.

(5) Then, the releasing film and the cover film are removed so that the laminated body is divided into unit sheets for package.

(6) After the packaging step, rigid-flexible boards are divided individually from the unit sheets.

In the present specification, the wording "unit board" means a minimum unit board under manufacture, and the wording "complex board" means a single board made by combining a different kinds of unit boards. In the present specification, the wording "unit sheet for package" means a unit for package which is composed of a plurality of unit boards or a plurality of complex boards. In the present specification, the wording "assembled panel" means a board to be functioned as a single board wherein a plurality of boards are built in one board or a plurality of complex boards are built in one board, and then, to be divided into unit boards, complex unit boards or unit sheets for package after manufacturing process. In the present specification, the wording "horizontal circuit area" means an interlayer circuit of an circuit board, and the wording "vertical circuit area" means an interlayer connection for connecting different circuit layers at a single board or a complex board, and the wording "connector" means a connector for electrically connecting boards. As the connector, a conductive bump, a pad, a portion of the horizontal circuit area can be exemplified.

In a conventional manufacturing method of printed circuit board assembled panel, however, the intended assembled panel can be made by using a flexible board with the same size as the assembled panel so that the productive cost of the assembled panel can be increased because the flexible board is expensive.

In the conventional manufacturing method, it is required that a frame for handling is formed at each printed circuit board by cutting off the corresponding portion of the printed circuit board so that much waste is created and thus, the material using efficiency is deteriorated.

Moreover, in the conventional assembled panel, since the finally shaped printed circuit boards are built in a large board, if one unit sheet is failed, the assembled panel is also failed so that the productive yield of the assembled panel is lowered.

SUMMARY OF THE INVENTION

As described above, in the conventional manufacturing method of printed circuit board assembled panel, the intended assembled panel can be made by using a flexible board with the same size as the assembled panel so that the productive cost of the assembled panel can be increased because the flexible board is expensive.

In the conventional manufacturing method, it is required that a frame for handling is formed at each printed circuit board by cutting off the corresponding portion of the printed circuit board so that much waste is created and thus, the material using efficiency is deteriorated.

Moreover, in the conventional assembled panel, since the finally shaped printed circuit boards are built in a large board, if one unit sheet is failed, the assembled panel is also failed so that the productive yield of the assembled panel is lowered.

The present invention is established in order to iron out the above-mentioned problems. In this point of view, an aspect of the present invention relates to a printed circuit board assembled panel comprises: a frame; and a plurality of unit boards which are to be aligned in the frame in a given shape and which include respective protrusions at the peripheries thereof, wherein the unit boards are fixed to one another with an adhesive through the protrusions and fixed integrally to the frame through the protrusions.

It is desired that the unit boards are aligned in said frame so that the surface level of the unit boards are equal to one another. In this case, the accuracy for cream soldering and package can be enhanced and the package efficiency can be enhanced.

The printed circuit board assembled panel can be also applied not only for the same kind of printed circuit board, but also for different kinds of printed circuit board.

In this point of view, another aspect of the present invention relates to a printed circuit board assembled panel comprises: a frame; and a plurality of complex boards including a plurality of rigid boards with respective protrusions at the peripheries thereof and a plurality of flexible boards which are to be aligned in said frame in a given shape, wherein the complex boards are fixed to one another with an adhesive through said protrusions and fixed integrally to the frame through the protrusions.

In the complex boards, the connectors of the rigid boards may be directly connected to connectors of the flexible boards.

It is also desired that the complex boards are aligned in the frame so that the surface level of the complex boards are equal to one another. In this case, too, the accuracy for cream soldering and package can be enhanced and the package efficiency can be enhanced.

In this aspect, some of the rigid boards are combined with one another through one or more of the flexible boards.

Still another aspect of the present invention relates to a unit sheet for packaging a printed circuit board comprises: a frame; and a plurality of unit boards which are to be aligned in the frame in a given shape and which include respective protrusions at the peripheries thereof, wherein the unit boards are fixed to one another with an adhesive through the protrusions and fixed integrally to the frame through the protrusions.

In this aspect, the space (length) between the adjacent unit sheets may be set commensurate with the specifications of a machine to be used.

It is also desired that the unit boards are aligned in the frame so that the surface level of the unit boards are equal to one another. In this case, too, the accuracy for cream soldering and package can be enhanced and the package efficiency can be enhanced.

A further aspect of the present invention relates to a unit sheet for packaging a printed circuit board comprises: a frame; and a plurality of complex boards including a plurality of rigid boards with respective protrusions at the peripheries thereof and a plurality of flexible boards which are to be aligned in the frame in a given shape, wherein the complex boards are fixed to one another with an adhesive through the protrusions and fixed integrally to the frame through the protrusions.

In this aspect, it is also desired that the complex board are aligned in the frame so that the surface level of the complex boards are equal to one another.

Then, in this aspect, some of the rigid boards are combined with one another through one or more of the flexible boards.

The unit sheet can be manufactured as fabricating an assembled panel in which a plurality of unit sheets for package are built in using a complex frame including a plurality of unit boards for package which are combined in plane with one another and dividing the assembled panel into the unit sheets for package.

The frame functions as a template to arrange the unit boards. In this case, the unit boards are arranged and fixed in the frame two-dimensionally or three-dimensionally to be packed through various treatments. The frame also functions as a printing board for printing handling parts and/or part numbers and a position-determining member for package by forming guiding holes.

The frame may be made of a rectangular case to which various pre-treatments can be applied before package. Of course, the rectangular case can be mounted as the frame on the packaging machine. If the unit sheet is downsized so as to be mounted on the packaging machine, a plurality of small unit sheets may be arranged in the frame, e.g., in a matrix shape. The frame shape may be deformed commensurate with the unit board shape. For example, since the unit board may be formed in a rectangular waved shape, circular shape, elliptical shape, the frame shape can be deformed commensurate with such a shape as exemplified above. It is desired that the thickness of the frame is set equal to or lower than the thickness of the unit board to be arranged in the frame in view of the printing process. It is not required that the frame is made of the same material as the unit board. For example, the frame may be made of a material with higher decay resistance so as to be used repeatedly, and of a not expensive material in comparison with the material of the unit board so as to be disposed per use.

The unit board may be made of, e.g., a rigid board or flexible board. The rigid board may be made of a glass cloth, an aramid nonwoven cloth, a prepreg which is formed by infiltrating epoxy resin (not hardened), polyimide resin, phenol resin, etc., into a base of paper, a single ceramic board or a multilayered printed circuit board. The flexible board may be made of a two-sided flexible board with a liquid polymer or a polyimide resin as an interlayer insulating layer or a single flexible board with a polyimide film as an insulating film.

The unit boards are arranged in the frame as follows.

First of all, protrusions are formed at the peripheries of the unit boards and depressed portions are formed at the inner wall of the frame so that the protrusions are engaged with the depressed portions. The thus obtained arrangement is tentatively fixed with weak adhesive in view of the alignment using an aligning machine. Then, the unit boards are aligned finally in a predetermined arrangement using the aligning machine. In this case, the final arrangement is fixed with instant adhesive or UV cure adhesive, and thermally treated.

In this case, since the unit boards are fixed to the frame, the thus obtained assembled board can be processed as one unit.

The complex boards are arranged in the frame as follows.

(1) A plurality of unit rigid boards with connectors and a plurality of unit flexible boards with connectors are prepared. Then, the rigid boards are arranged in the frame so that the rigid boards are tentatively fixed to one another and to the frame. Then, the unit flexible boards are disposed over and combined with the tentatively fixed unit rigid boards so that the connectors of the unit rigid boards are connected with the connectors of the unit flexible boards.

(2) A plurality of unit rigid boards with connectors and an elongated flexible board with connectors over the unit rigid boards when combined are prepared. Then, the rigid boards are arranged in the frame so that the rigid boards are tentatively fixed to one another and to the frame. Then, the elongated flexible boards are disposed over and combined with the tentatively fixed unit rigid boards so that the connectors of the unit rigid boards are connected with the connectors of the flexible board.

(3) A plurality of unit flexible boards with connectors and an elongated rigid board with connectors over the unit flexible boards when combined are prepared. Then, the elongated rigid board is arranged in and fixed to the frame. Then, the flexible boards are disposed over and combined with the rigid board so that the connectors of the rigid board are connected with the connectors of the flexible boards, and thus, the flexible boards are fixed to the rigid board.

(4) An elongated rigid board with connectors and an elongated flexible board with connectors are prepared. Then, the rigid board is fixed to the flexible board in the frame so that the connectors of the rigid board are connected with the connectors of the flexible board.

In (1)-(4), the vertical position of the (unit) rigid board(s) and the (unit) flexible board(s) can be reversed only if the (unit) rigid board(s) are combined with the (unit) flexible board(s). For example, the (unit) flexible board(s) may be arranged in the frame and the (unit) rigid board(s) may be disposed over the (unit) flexible board(s).

In a still further aspect of the present invention relates to a rigid-flexible board wherein a rigid board and a flexible board are laminated integrally via an insulating layer so that a vertical circuit area penetrating through the insulating layer can connect electrically horizontal circuit areas of the rigid board and the flexible board, wherein the vertical circuit area is a conductive bump which is positioned at the horizontal circuit area of the rigid board or the flexible board and which is pressed against the horizontal circuit area of the flexible board or the rigid board so that the forefront of the conductive bump is plastic-deformed through the insulating layer, and wherein the flexible board is exposed to an outer layer.

In this aspect, the vertical circuit area may be a laser skip via including a hole formed by means of the irradiation of laser beam for the flexible board and the insulating layer so that a horizontal circuit area of the rigid board is exposed and a conductive layer applied onto the inner wall of the hole.

In this aspect, the vertical circuit area may be a conductive body made of a through hole positioned commensurate with the connectors of the horizontal circuit area of the rigid board and the flexible board and of a conductive material filled in the through hole. The conductive body is electrically connected with the connectors through thermal pressing.

In another aspect of the present invention relates to a method for manufacturing a rigid-flexible board wherein a rigid board and a flexible board are laminated integrally via an insulating layer so that a vertical circuit area penetrating through the insulating layer can connect electrically horizontal circuit areas of the rigid board and the flexible board, comprising the steps of: preparing the rigid board with a conductive bump constituting the vertical circuit area which is positioned at the horizontal circuit area formed at an outer layer; laminating a thermal melting resin sheet under non-hardening condition on the rigid board over the conductive bump; thermally pressing the thermal melting resin sheet so that the forefront of the conductive bump is exposed through the thermal melting resin layer; preparing the flexible board with a connector and the horizontal circuit area which are formed at an outer surface of the flexible board so that the connector is connected with the horizontal circuit area and corresponds to the vertical circuit area; and laminating the rigid board and the flexible board through thermal pressing so that the conductive bump is opposite to the connector and the forefront of the conductive bump is plastic-deformed through the insulating layer.

In this aspect, the conductive bump constituting the vertical circuit area may be formed on the flexile board or the rigid board.

In this aspect, the vertical circuit area may be made of a laser via hole or a laser skip via.

As described above, according to the printed circuit board assembled panel, the unit sheet for packaging a printed circuit board, the rigid-flexible board and the method for manufacturing the same of the present invention, since the unit boards are prepared in advance, if one or more unit boards are failed, the laminated body from the unit board can not be failed by removing the failed unit board(s). In this point of view, the productive yield can be enhanced, and material loss can be lowered. Therefore, not expensive and disposal material can be employed for the unit boards.

In the fabrication of complex board, since one or more unit boards can be formed from the printed circuit boards which are fabricated independently, waste material to be punched out can be reduced so that the material loss can be lowered remarkably. Particularly, according to (1), since an expensive material can be applied only to the inherent flexible board, the material cost can be lowered remarkably.

EXPLANATION FOR REFERENCES 1, 3 . . . assembled panel of rigid board; 1a, 3a unit rigid board; 2 . . . assembled panel of printed circuit board; 2a . . . unit flexible board; 4 . . . frame; 4a frame for packaging unit sheet; 5 . . . polyimide film; (6) . . . electrolytic cupper foil; 7 . . . through hole; 8 . . . horizontal circuit area; 9 . . . protective film; 10 . . . connector; 11 . . . conductive bump (connecting terminal); 12 . . . glass-epoxy based prepreg (synthetic resin sheet); 13, 32 . . . flexible board; 14, 31, 31a, 31b . . . rigid board; 15 . . . horizontal circuit area; 16 . . . vertical circuit area; 17 . . . insulating layer made of hardened glass-epoxy based prepreg (synthetic resin sheet); 18 . . . protective film; 19, 19a . . . protrusion; 20, 20a . . . depressed portion; 21 . . . adhesive; M . . . alignment mark; 27 . . . connector; 33 . . . laser via hole; 34 . . . laser skip via; 35 . . . vertical circuit area made of hardened conductive paste filled in through hole of insulating layer

BEST MODE FOR IMPLEMENTING THE INVENTION

An embodiment according to the present invention will be described with reference to drawings.

FIGS. 1-34 relate to an embodiment according to the present invention where two unit rigid boards are combined with one unit flexible board to form a complex rigid board assembled panel.

Figure 1:
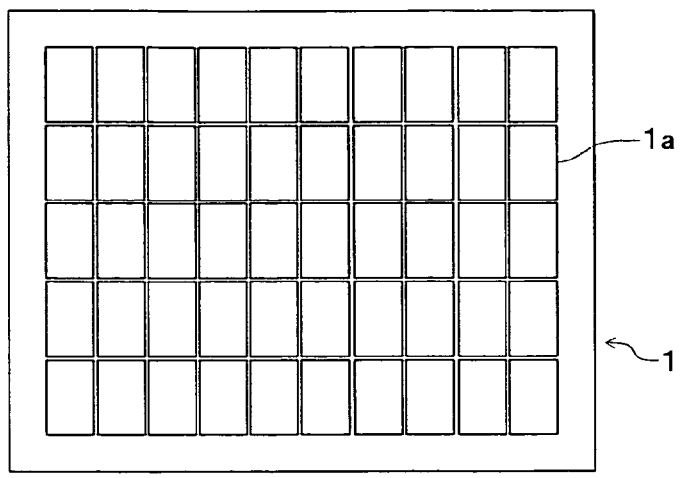
FIG. 1 is a plan view schematically illustrating a rigid board to be divided into unit boards.
Figure 2:
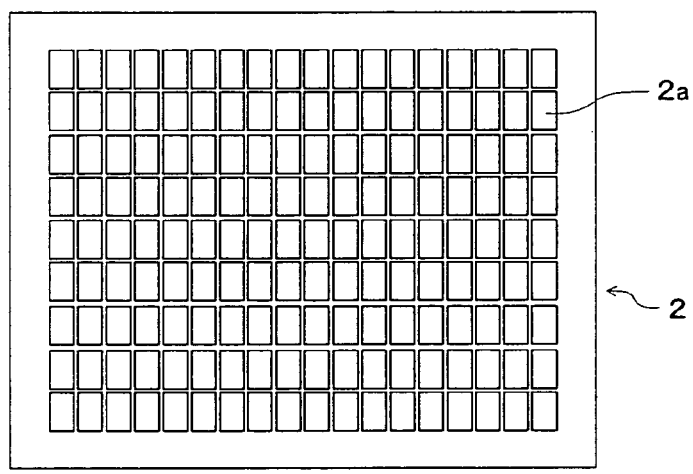
FIG. 2 is a plan view schematically illustrating a flexible board to be divided into unit boards.
Figure 3:
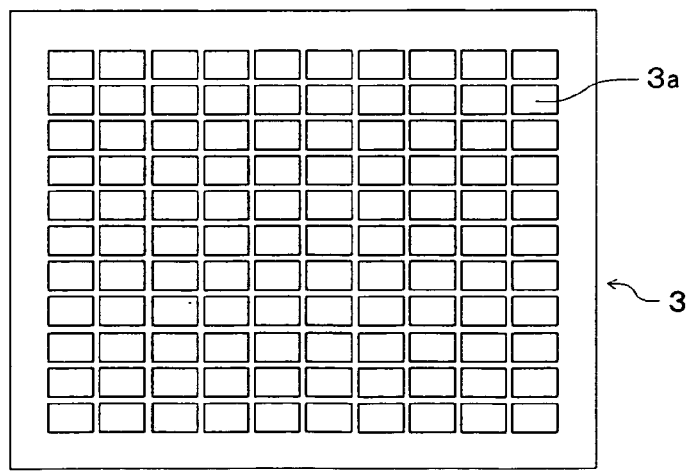
FIG. 3 is a cross sectional view schematically illustrating a rigid board to be divided into unit boards.

FIG. 1 shows a rigid board assembled panel 1 which is composed of 50 unit rigid boards 1a. FIG. 2 shows a flexible board assembled panel 2 which is composed of 162 unit flexible boards 2a. FIG. 3 shows a rigid board assembled panel 3 which is composed of 110 unit rigid boards 3a.

The assembled panels 1, 3 illustrated in FIGS. 1 and 3 are eight layered printed circuit boards, respectively. The assembled-panel 2 illustrated in FIG. 2 is a two-sided flexible board. In the circuit boards and the flexible board, the outer circuit pattern and the protective layer over the circuit pattern are formed integrally. The assembled panels 1-3 are divided into unit rigid boards 1a, 3a and unit flexible board 2a, respectively along the lattice-shaped lines.

As described hereinafter, a plurality of conductive bumps are formed as connectors at the horizontal circuit areas which are provided at the edges of the unit flexible boards 2a, respectively, and thermal melting layers are formed on the bases of the unit flexible boards, respectively.

Connectors are formed at the positions of the unit rigid boards 1a, 3a opposite to the conductive bumps of the unit flexible boards 2a, respectively.

Figure 4:
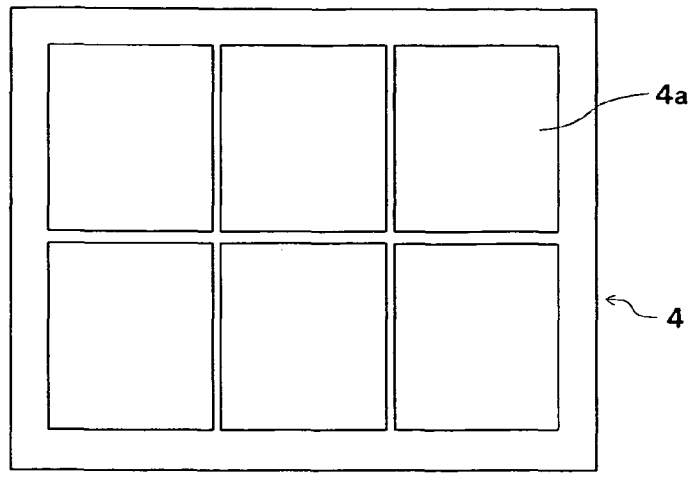
FIG. 4 is a plan view schematically illustrating a frame to be used.

FIG. 4 shows a frame 4 for fabricating the intended assembled panel. The frame 4 is composed of six unit sheet frames 4a for package which are arranged in planer matrix.

Figure 5:
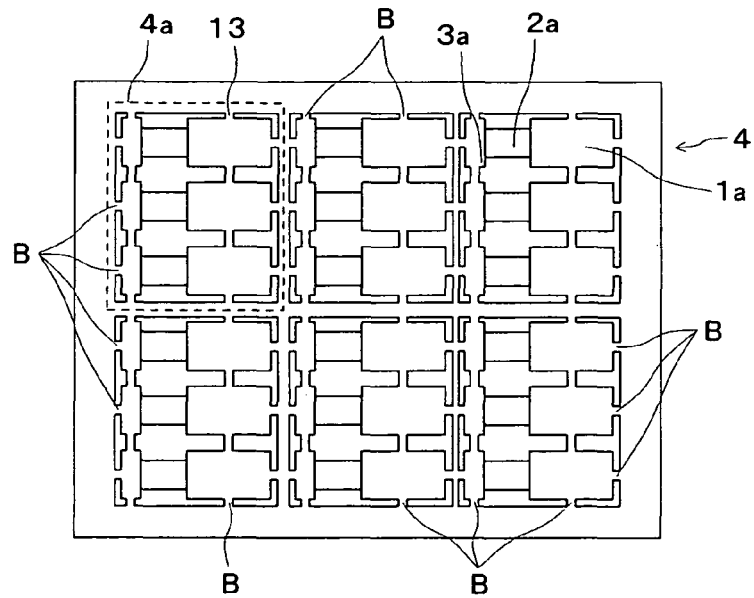
FIG. 5 is a plan view illustrating a state wherein unit rigid boards and flexile unit boards are arranged in a frame.

As illustrated in FIG. 5, the unit boards 1a-3a in FIGS. 1-3 are disposed in the frame 4, concretely in the unit sheet frames 4a for package. The unit rigid boards 1a, 3a are fixed tentatively with one another at the protrusions B provided at the peripheries of the unit rigid boards 1a, 3a. Then, the unit rigid boards are fixed tentatively to the frames 4a with the protrusions B.

Figure 6:
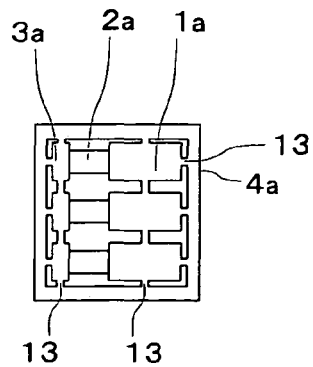
FIG. 6 is a plan view illustrating a unit sheet for package.
Figure 7:
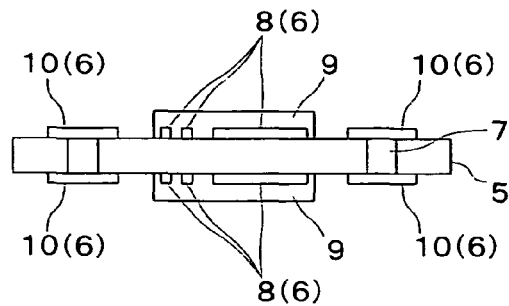
FIG. 7 is a plan view schematically illustrating a main part of a flexible board to be divided into unit boards.

In this way, a plurality of assembled panels are prepared and then, disposed between thermal plates to be combined with one another through thermal pressing so that the conductive bumps (not shown) of the unit flexible boards 2a are pressed against and electrically connected with the connectors (not shown) of the unit rigid boards 1a, 3a. In this case, the conductive bumps are mechanically combined with the connectors. As illustrated in FIG. 6, the assembled panel may be divided into unit sheet 4a for package, and then, shipped as occasion demands.

Then, the manufacturing method of flexible board and rigid board, the manufacturing method of assembled panel and unit sheet for package and the manufacturing method of rigid-flexible board will be explained hereinafter. In this case, the rigid-flexible board is configured such that the rigid board is combined with the flexible board to form a complex board.

For simplification, the manufacturing method of unit board or complex unit board will be explained, but in fact, the unit boards or the complex unit boards are formed as the assembled panel illustrated in FIGS. 1-5, and then, divided into unit sheets for package.

(Formation of Flexible Board)

First of all, electrolytic copper foils 6 with a thickness of 18 μm are applied on the both main surfaces of the polyimide film 5 (PI) with a thickness of 25 μm to form a flexible board with copper foils on both of the main surfaces wherein through holes (TH) are formed at predetermined positions of the board. Then, the electrolytic copper foils 6 are etched to form horizontal circuit areas 8, and then, a protective film 9 is formed over the horizontal circuit areas 8 so as to expose connectors 10 which are formed at the same time when the horizontal circuit areas 8 are formed, thereby forming the intended flexible board (FIG. 7; hereinafter, a bracket numeral designates a member before processing).

Figure 8:
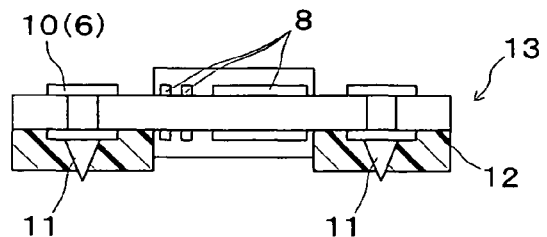
FIG. 8 is a plan view illustrating a main part of a flexible board with bumps to be divided into unit boards.

Then, an Ag-based polymer type conductive paste (trade name: thermosetting conductive paste MSP-812 made by Mitsui Chemicals, Inc.) is coated on the connector 10 formed at one main surface of the flexible board to form the conductive bumps (connectors) as follows (FIG. 8).

First of all, a metal mask with holes of 0.35 mm in diameter and made of stainless steel plate with a thickness of 300 μm is prepared. The metal mask is aligned for one main surface of the flexible board, and the conductive paste is coated over the metal mask, and dried. The same steps are repeated three times so that the conical conductive bumps 11 are formed in a height of 200-300 μm. Then, glass-epoxy based prepregs (synthetic resin sheets) 12 with a thickness of 60 μm are contacted with the conductive bumps 11, disposed between thermal plates kept at about 100° C. via aluminum foils or rubber sheets, and pressed under a pressure of 1 MPa during one minute, thereby forming a flexible board 13 so that the forefronts of the conductive bumps 11 protrude from the top surfaces of the glass-epoxy based prepregs (synthetic (Formation of Rigid Board)

Figure 9:
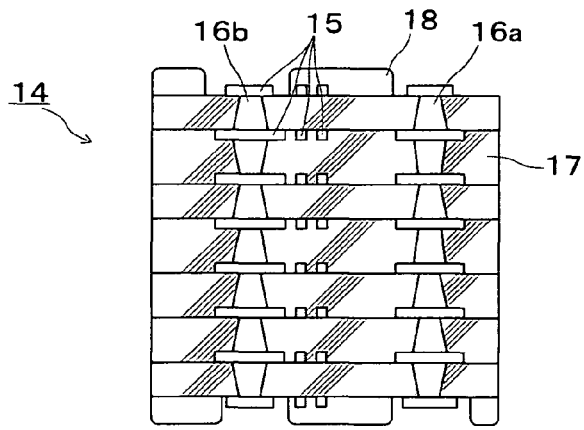
FIG. 9 is a plan view illustrating a main part of a rigid board to be divided into unit boards.

The intended rigid board as illustrated in FIG. 9 can be formed in accordance with Japanese Patent Application Laid-open No. 8-204332. The forming method is known as B²it (B-square-it: Trade mark). In FIG. 9, the reference numeral "15" designates horizontal circuit areas, respectively, which are made of electrolytic cupper foils with a thickness of 18 μm through patterning. The reference numerals "16a" and "16b" designate vertical circuit areas, respectively, which are made of Ag-based polymer type conductive paste (trade name: thermosetting conductive paste MSP-812 made by Mitsui Chemicals, Inc.) formed on the copper foils or the horizontal circuit areas through hardening. In this case, the hardened conductive paste is formed as the conical conductive bumps with a height of 200-300 μm so that the vertical circuit areas are formed by the conical conductive bumps, respectively. The reference numeral "17" designates the insulating layers which are made of the hardened glass-epoxy based prepregs (synthetic resin sheets) 12 with a thickness of 60 μm. The reference numeral "18" designates protective films covering the outer circuit pattern. The vertical circuit areas 16a, 16b are formed so as to penetrate through the rigid board 14 in the thickness direction. The vertical circuit areas 16a, 16b can be used as detecting connectors for checking the electrical connection.

(Formation of Rigid-Flexible Board)

Figure 10:
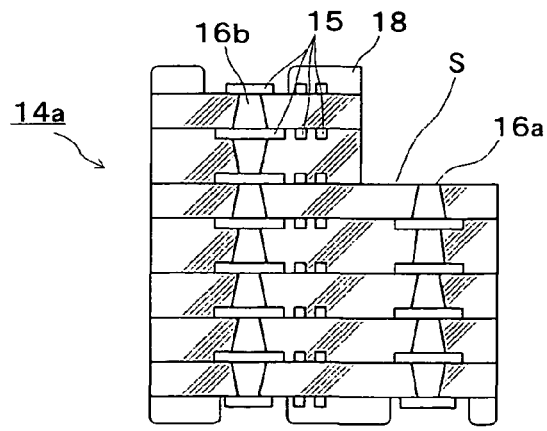
FIG. 10 is a plan view illustrating a main part of a rigid board with a step to be divided into unit boards.

The spot facing process is carried out for the larger rigid board before division or the divided unit rigid board so that the processed depth is equal to or larger than the thickness of the flexible board 13 to be connected. In this way, the rigid board 14a with a step S to expose the vertical circuit area 16a is formed (FIG. 10).

Then, the unit rigid boards 14a with the steps S to expose the corresponding vertical circuit areas 16a and the unit flexible boards 13 are arranged in the frame so as to form the intended final structure.

In this case, step S to expose the vertical circuit area 5 can be configured such that the horizontal circuit areas 4 can sandwich the vertical circuit area 5, but the horizontal circuit areas 4 can be removed in view of the spot facing process accuracy. The step S may be processed with a router before etching.

Figure 11:
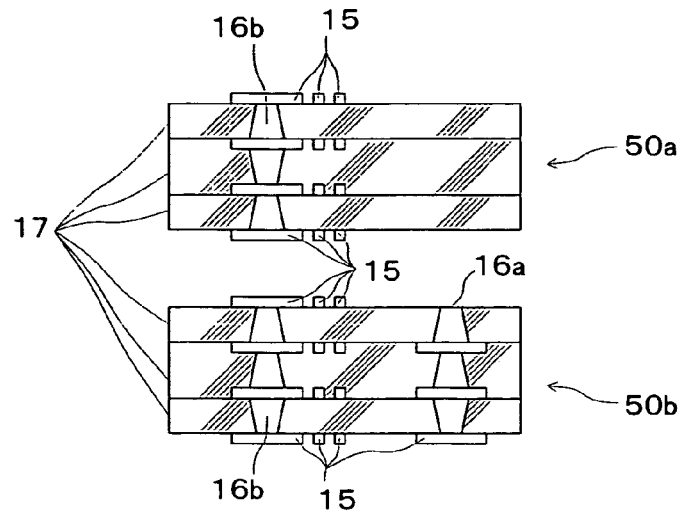
FIG. 11 is an explanatory view for manufacturing the rigid board with the step.
Figure 12:
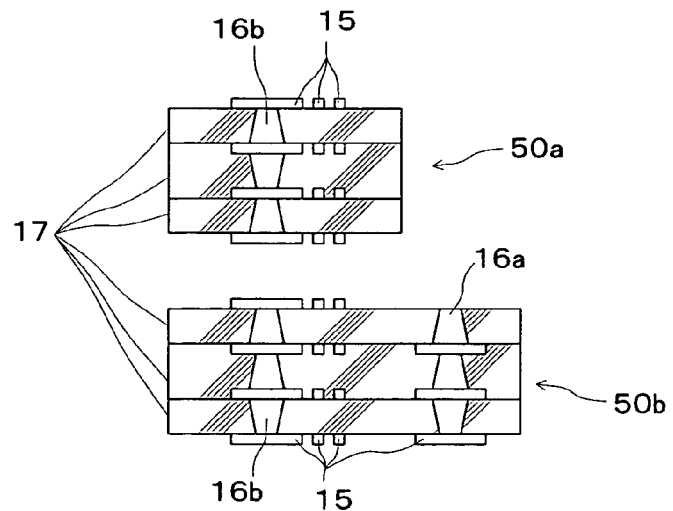
FIG. 12 is an explanatory view for manufacturing the rigid board with the step.
Figure 13:
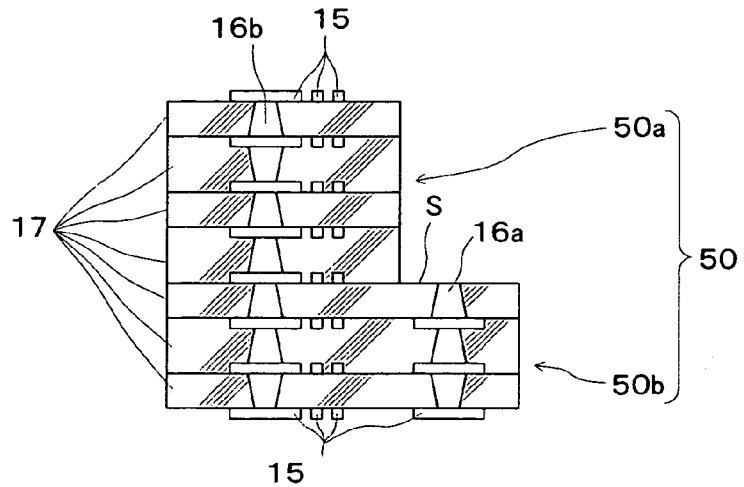
FIG. 13 is an explanatory view for manufacturing the rigid board with the step.

FIGS. 11-13 relate to another forming method of the rigid board with a step. In this embodiment, the upper laminated plate 50a, which is to be positioned above the step, is formed and the lower laminated plate 50b, which is to be positioned below the step, is formed, independently (FIG. 11). Then, the portion to be the step S of the laminated plate 50a is cut off (FIG. 12), and the laminated plate 50a with the step S is aligned for the laminated plate 50b, thereby forming the intended rigid board 50 with the step S through thermal pressing (FIG. 13).

Figure 14:
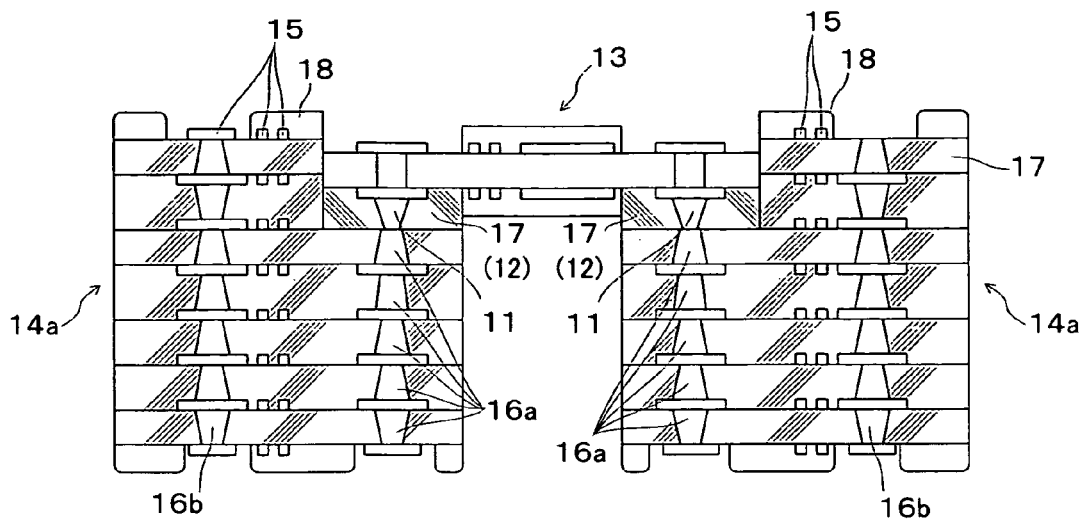
FIG. 14 is a cross sectional view schematically illustrating a state where a rigid board to be divided into unit boards and a flexible board to be divided into unit boards are combined.

FIG. 14 shows the state where the rigid boards 14a with the steps S are aligned in the frame so that the steps S of the rigid board 14a are opposed to one another and the flexible boards 13 are fixed tentatively over the steps S of the rigid boards 14a. Then, the conductive bumps 11 are contacted and electrically connected with the vertical circuit areas 16a, respectively, through the thermal pressing. Then, the rigid boards 13a are mechanically and integrally combined with the flexible board 13 via the glass-epoxy based prepregs 12 (hardened prepregs 17).

In this embodiment, the vertical circuit areas 16a can be used as detecting connectors for checking the electrical connection between the flexible board 13 and the rigid boards 14a in addition to as the connectors for the horizontal circuit areas 15. The vertical circuit areas 16b can be used as detecting connectors for checking the connection between the layers constituting the rigid boards 14a.

Figure 15:
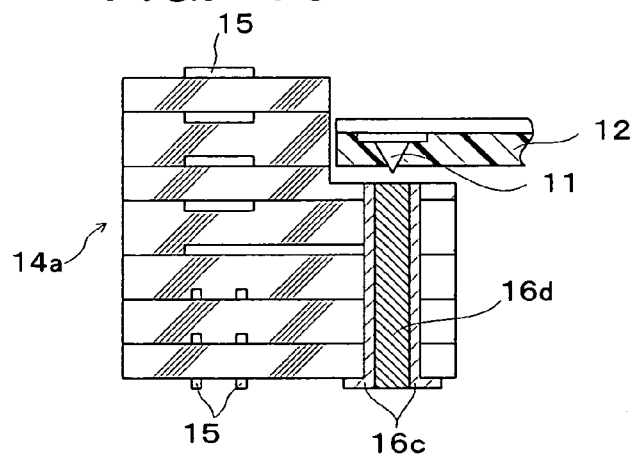
FIG. 15 is a cross sectional view schematically illustrating another state where a rigid board to be divided into unit boards and a flexible board to be divided into unit boards are combined.
Figure 16:
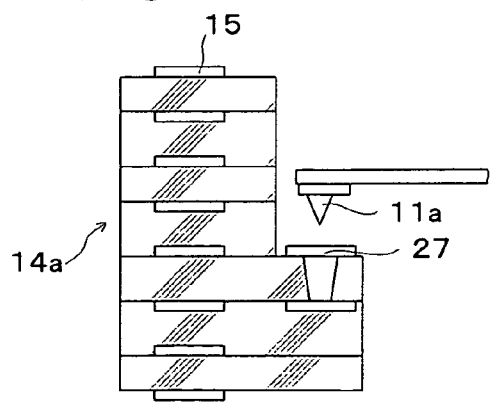
FIG. 16 is a cross sectional view schematically illustrating still another state where a rigid board to be divided into unit boards and a flexible board to be divided into unit boards are combined.

In this embodiment, the vertical circuit areas to connect the unit flexible board 13 are made of the conductive bumps 16a hardened from the conductive paste, but the present invention is not limited to the above-described embodiment. For example, as illustrated in FIG. 15, the vertical circuit area can be made by filling the conductive paste 16d into the via hole 16c. Then, as illustrated in FIG. 16, the conductive bump 11a is made from a high temperature solder (e.g., within a melting point range of 200-240° C.), and then, connected to the connector 27 formed at the step S of the rigid board 14a.

The connection between the unit rigid boards and the unit flexible board has been described in detail above. The unit rigid boards 14a are fixed to the frame 4 on the basis of the steps as illustrated in FIGS. 17-25.

Figure 17:
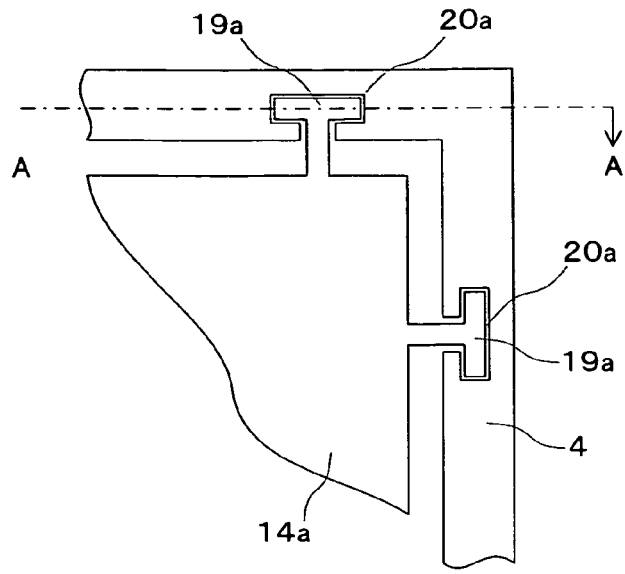
FIG. 17 is a plan view illustrating a connection between the frame and the unit rigid boards.
Figure 18:
FIG. 18 is a cross sectional view of the connection illustrated in FIG. 17, taken on line A-A.
Figure 19:
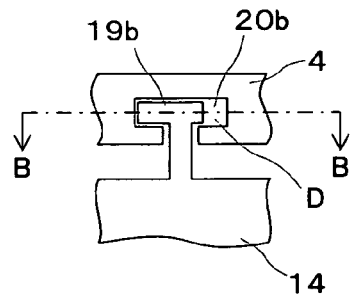
FIG. 19 is a plan view illustrating another connection between the frame and the unit rigid boards.
Figure 20:
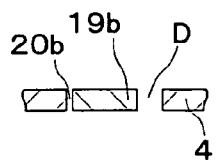
FIG. 20 is a cross sectional view of the connection illustrated in FIG. 19, taken on line B-B.
Figure 21:
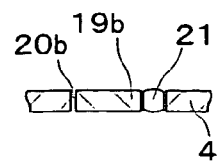
FIG. 21 is a cross sectional view of the connection illustrated in FIG. 19, taken on line B-B.

In the embodiment relating to FIGS. 17-18, the T-shaped protrusions 19a are formed at the edges of the unit rigid board 14a and the depressed portions 20a are formed at the inner wall of the frame 4 so that the unit rigid boards are fixed to the frame 4 by inserting the protrusion 19a of the unit rigid boards 14a into the depressed portions 20a of the frame 4. In the embodiment relating to FIGS. 19-21, the space D is formed between the protrusion 19b and the depressed portion 20b. In this case, an adhesive 21 is filled in the space D so that the protrusion 19b is fixed tentatively with the depressed portion 20b with the adhesive 21.

Figure 22:
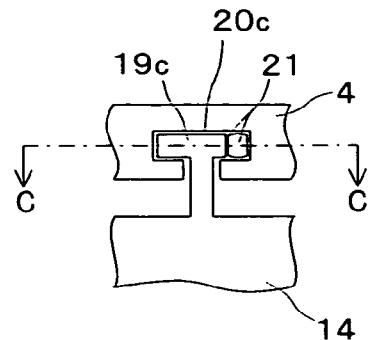
FIG. 22 is a plan view illustrating still another connection between the frame and the unit rigid boards.
Figure 23:
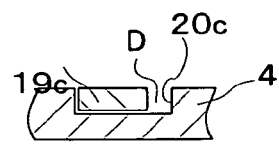
FIG. 23 is a cross sectional view of the connection illustrated in FIG. 22, taken on line C-C.
Figure 24:
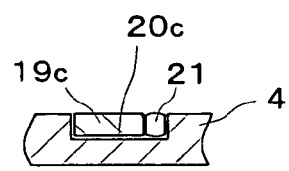
FIG. 24 is a cross sectional view of the connection illustrated in FIG. 22, taken on line C-C.
Figure 25:
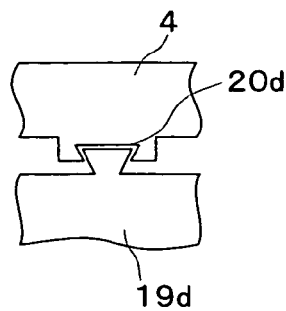
FIG. 25 is a plan view illustrating a further connection between the frame and the unit rigid boards.

Then, in the embodiment relating to FIGS. 22-24, the depressed portion 20c of the frame 4 includes the bottom for supporting the protrusion 19c of the unit rigid board 14 and the space D between the protrusion 19c and the depressed portion 20c. In this case, the protrusion 19c is fixed tentatively with the depressed portion 20c with an adhesive. In the embodiment relating to FIG. 25, the protrusion 19d is formed in a wedge shape and the depressed portion 20d is formed so as to match the shape of the protrusion 19d. In this case, the protrusion 19d is completely fixed in the depressed portion 20d. The connection is located between the frame 4 and the unit rigid board 14a.

Figure 26:
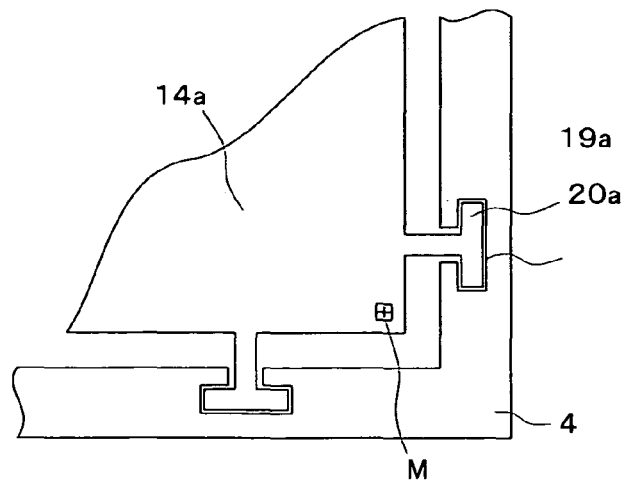
FIG. 26 is a plan view illustrating an alignment mark provided at the corner of the unit rigid board.
Figure 27:
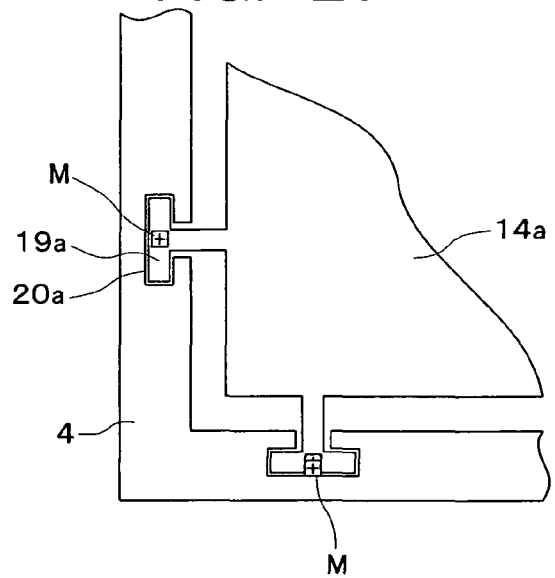
FIG. 27 is a plan view illustrating an alignment mark provided at the protrusion of the unit rigid board.
Figure 28:
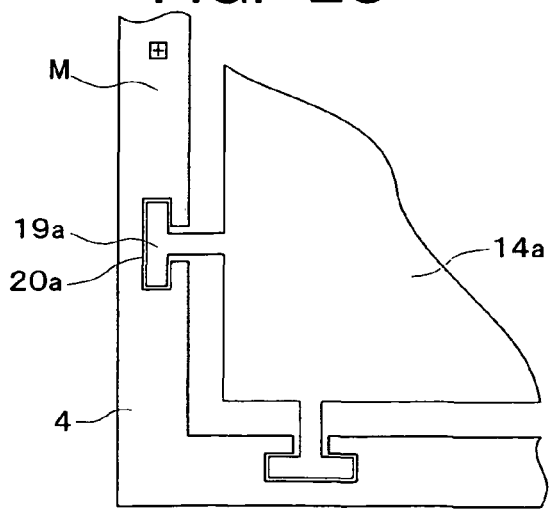
FIG. 28 is a plan view illustrating an alignment mark provided at the corner of the frame.

FIGS. 26-28 show states where the alignment mark M for position determination in package are provided in the vicinity of the connection between the frame 4 and the unit rigid board 14a.

In FIG. 26, the alignment mark M is provided at the corner of the unit rigid board 14a fixed at the corner of the frame 4. In this case, the position determination in package can be carried out at high accuracy under the condition of the nonuse of the surface of the frame. However, since the alignment mark is provided at the unit rigid board 14a constituting a product, the use efficiency of the product is deteriorated. In FIG. 27, the alignment mark M is provided at the T-shaped protrusion 19a of the unit rigid board 14a fixed at the corner of the frame 4. In this case, since the protrusion 19a is inserted into the depressed portion 20a, the width of the frame 4 is increased. In FIG. 28, the alignment mark M is provided at the corner of the frame 4. In this case, the use efficiency of the product is not deteriorated and the width of the frame 4 is not increased, but the position determination in package depends on the inserting error between the protrusion and the depressed portion.

Figure 29:
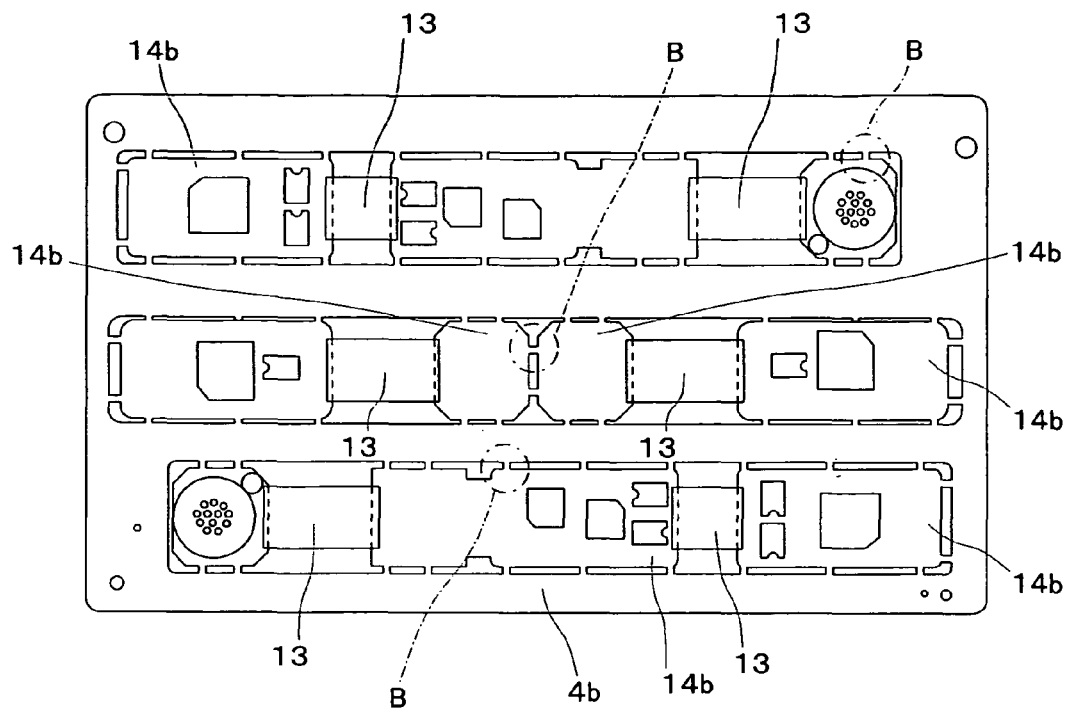
FIG. 29 is a plan view illustrating a still further connection between the frame and the unit rigid boards.
Figure 30:
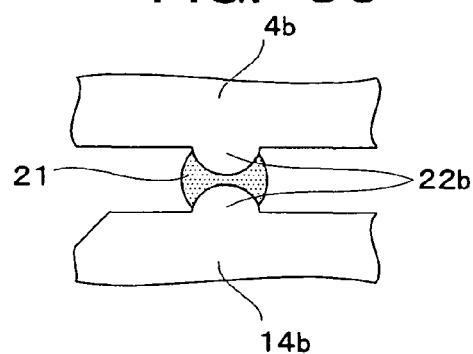
FIG. 30 is an enlarged plan view illustrating the connection illustrated in FIG. 26.
Figure 31:
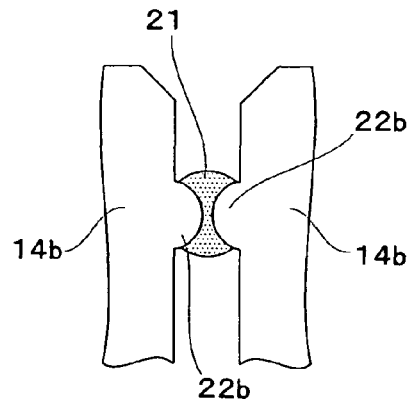
FIG. 31 is an enlarged plan view illustrating the connection illustrated in FIG. 26.
Figure 32:
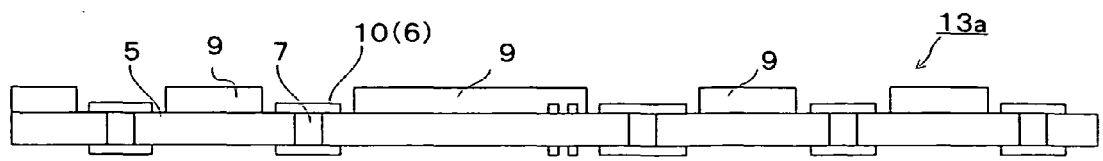
FIG. 32 is a plan view schematically illustrating a flexible board to be divided into unit boards.

FIGS. 29-31 show other states where the unit rigid boards 14b are fixed to the frame 4b and the unit rigid boards 14b are fixed to one another. In this embodiment, the protrusions 22b are formed at the peripheries of the unit rigid boards 14b so that the protrusions 22b are fixed to one another with an adhesive and the protrusions 22b are fixed to the protrusions 22b provided at the inner wall of the frame 4. FIGS. 30 and 31 are plan views in closeup showing the circled regions of FIG. 29.

In this way, the unit rigid boards 14b and the flexible boards 13 are fixed in the frame 4, and the thus obtained frame bodies are thermally pressed and laminated to form the intended rigid-flexible board.

FIGS. 32-36 relate to another embodiment according to the present invention.

The same references are imparted to like components throughout FIGS. 7-14 and 32-36. Therefore, the explanation for like components will be omitted.

In this embodiment, the elongated flexible board will be employed so as to constitute the outer layer over the adjacent unit rigid boards (FIG. 32), instead of the flexible board 13 illustrated in FIG. 29. In view of the package disturbance, the flexible board 13a is formed preferably over all of the unit rigid boards. The thermal melting resin (synthetic resin sheet) 12 made of glass-epoxy based prepreg and the conductive bumps 11 are formed on the flexible board 13a in accordance with FIG. 8.

Figure 33:
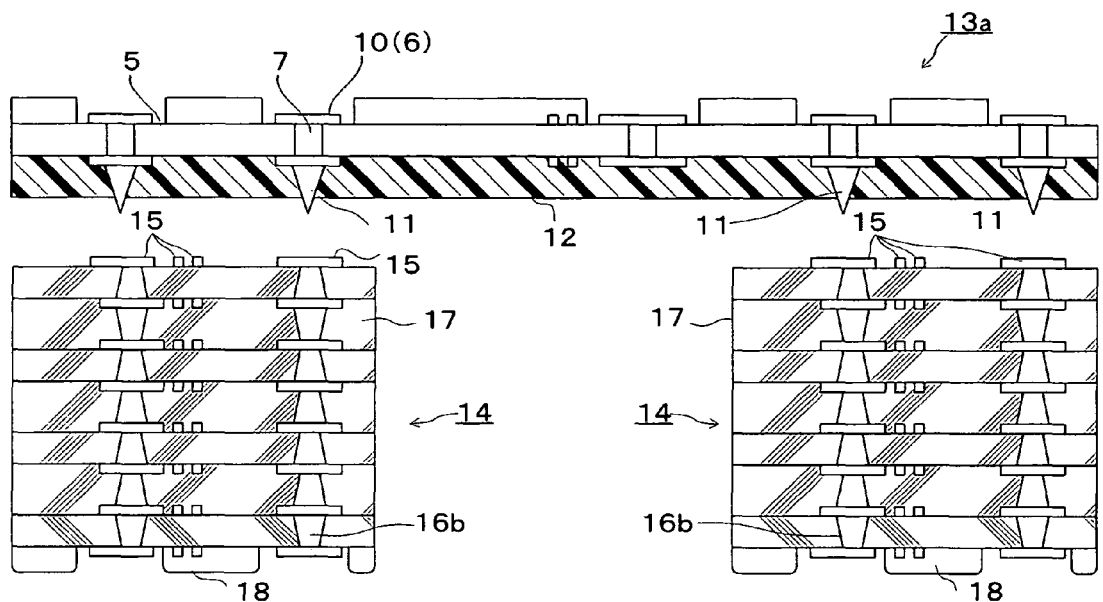
FIG. 33 is a cross sectional view schematically illustrating a state where unit rigid boards and a unit flexible board are connected with one another with conductive bumps (in this case, a thermal melting layer is formed over the flexible board).

Then, as illustrated in FIG. 33, the flexible board 13a is pressed against the unit rigid boards 14 so that the conductive bumps 11 penetrating through the thermal melting resin layer 12 are contacted with the horizontal circuit areas (connectors) 15. In this case, the flexible board 13a is combined with the unit rigid boards 14 under the condition that the conductive bumps 11 are electrically connected with the horizontal circuit areas 15. The thermally melting resin layer 13 is hardened to form the insulating layer 17 made of the glass-epoxy based prepreg. As a result, the rigid board is electrically and mechanically combined with the flexible board to form the intended integrated rigid-flexible board (FIG. 34).

Figure 34:
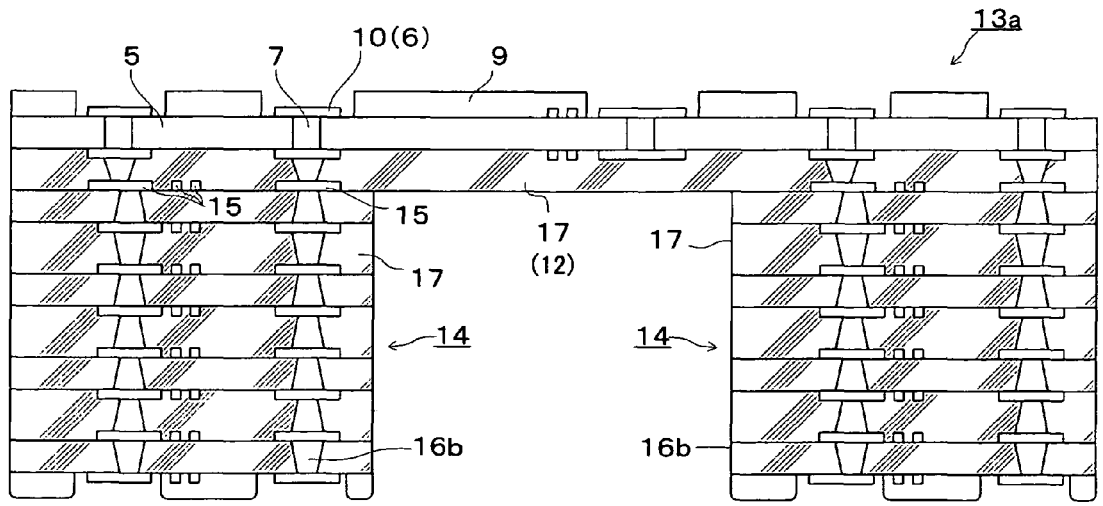
FIG. 34 is a cross sectional view schematically illustrating a state where the flexible board and the rigid boards are combined with one another in accordance with FIG. 33.
Figure 35:
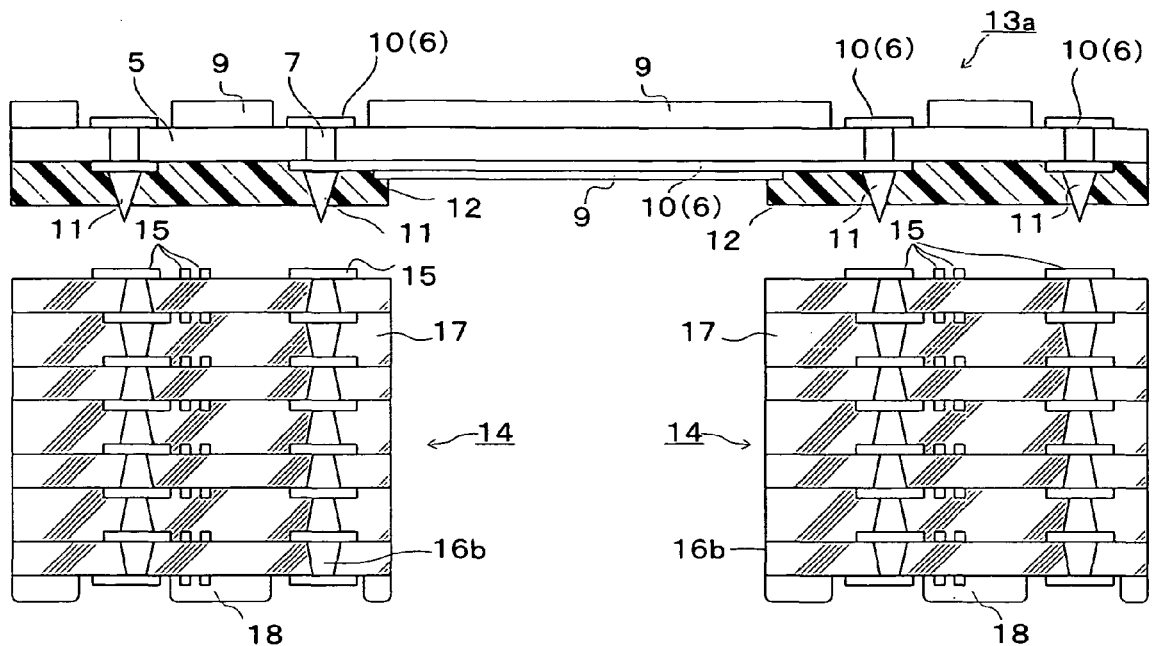
FIG. 35 is a cross sectional view schematically illustrating a state where unit rigid boards and a unit flexible board are connected with one another with conductive bumps (in this case, a portion of a thermal melting layer, formed on the flexible board, corresponding to the non-connecting area for the rigid board is removed in advance).
Figure 36:
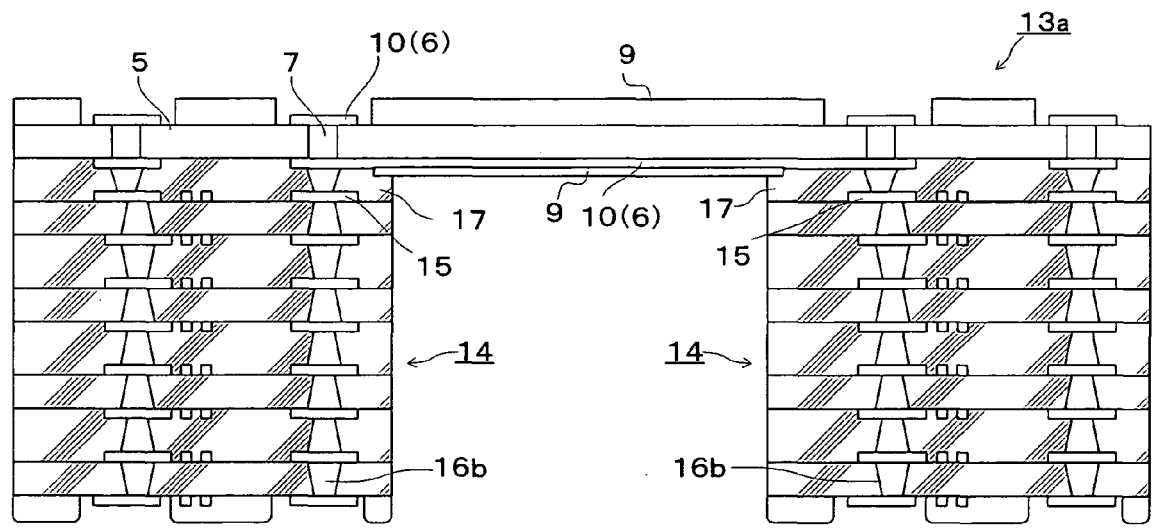
FIG. 36 is a cross sectional view schematically illustrating a state where the flexible board and the rigid boards are combined with one another in accordance with FIG. 35.

If the insulating layer 17 is flexible or the final product is not almost bended, the insulating layer 17 can be formed so as to contain the portion with which the unit rigid boards are not contacted, as illustrated in FIGS. 33 and 34. If the insulting layer 17 is not flexible or the final product is bended to some degrees, the connecting portion of the not-hardened glass-epoxy based prepreg 12 with the flexible board (not with the rigid board) is processed and removed with a router as illustrated in FIGS. 35 and 36.

The connection between the frame and the unit rigid boards are carried out in the same manner as illustrated in FIGS. 17-28.

FIGS. 37-43 relate to still another embodiment according to the present invention.

The same references are imparted to like components throughout FIGS. 7-14, 32-36 and 37-43. Therefore, the explanation for like components will be omitted.

In this embodiment, the elongated flexible board is also employed so as to constitute the outer layer over the adjacent unit rigid boards as illustrated in FIGS. 32-36, but the conductive bumps constituting the vertical circuit areas are formed on the unit rigid boards (FIG. 39), which is different from the embodiment relating to FIGS. 33 and 35. The conductive bumps are formed on the unit rigid boards, not on the flexible board. Then, the thermal melting resin layers 12 made of glass-epoxy based prepreg are applied over the conductive bumps so that the forefronts of the conductive bumps penetrate through the thermal melting resin layer 12 by means of thermal pressing to form the rigid boards 31a and 31b. Then, the rigid boards 31a and 31b are arranged in the frame so as to be the intended final structure. Then, the rigid boards 31a and 31b are thermally pressed against the flexible board so that the conductive bumps of the rigid boards are contacted with the horizontal circuit areas (connectors) of the flexible board. In this case, the rigid boards and the flexible board are electrically and mechanically connected with one another. The thermal melting resin layers 12 are hardened to form the insulating layers 17.

In this embodiment, the rigid boards are made in accordance with the B$^2$it forming method. The elongated flexible board to constitute the outer layer covering the adjacent rigid boards is prepared.

Figure 37:
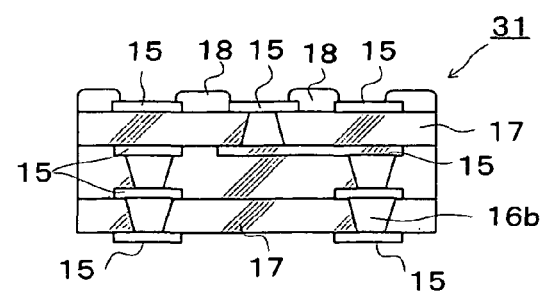
FIG. 37 is a cross sectional view schematically illustrating a unit rigid board.
Figure 38:
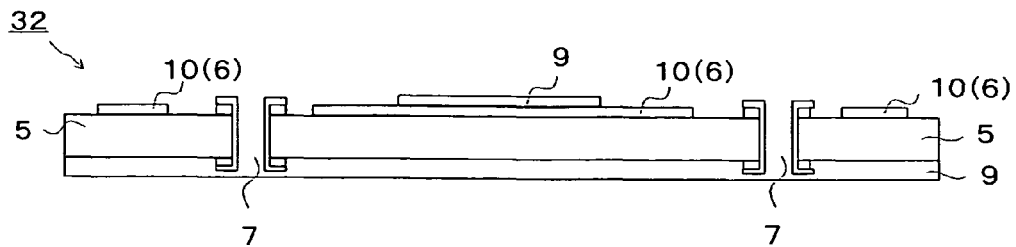
FIG. 38 is a cross sectional view schematically illustrating a unit flexible board.
Figure 39:
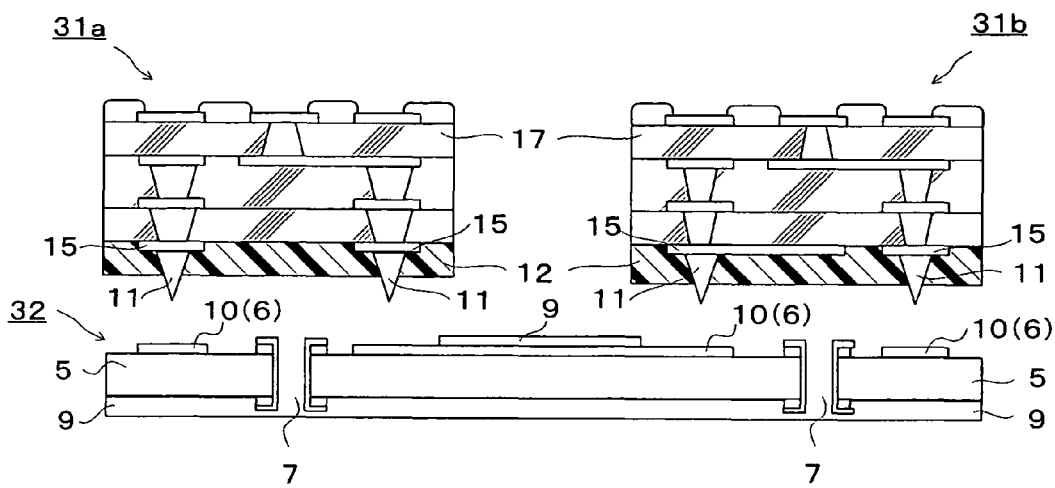
FIG. 39 is a cross sectional view schematically illustrating a state where unit rigid boards and a unit flexible board are connected with one another by conductive bumps formed on the unit rigid boards (in this case, the unit flexible board is interlayer-connected with the conductive bumps at the two-sided plates).
Figure 40:
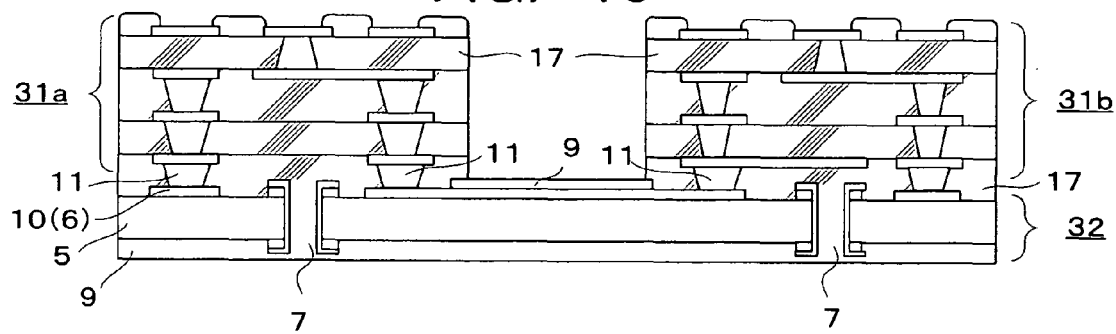
FIG. 40 is a cross sectional view schematically illustrating a state where the flexible board and the rigid boards are combined with one another in accordance with FIG. 39.

In this embodiment, the rigid board 31 may be composed of four circuit layers as illustrated in FIG. 37, and the interlayer connection may be carried out in accordance with the B$^2$it forming method. The flexible board 32 is interlayer-connected with the circuit layers which are formed on both of the main surfaces thereof by means of through holes 7.

Figure 41:
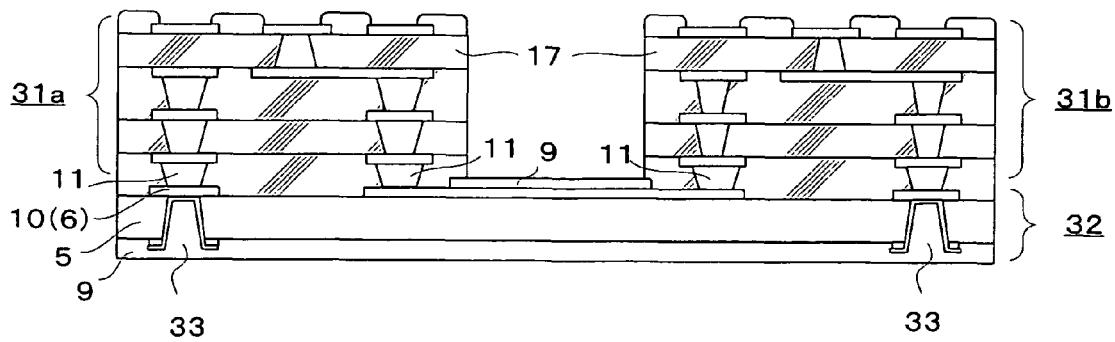
FIG. 41 is a cross sectional view schematically illustrating a state where unit rigid boards and a unit flexible board are connected with one another by conductive bumps formed on the unit rigid boards (in this case, the unit flexible boards are interlayer-connected with laser via holes at the two-sided plates).
Figure 42:
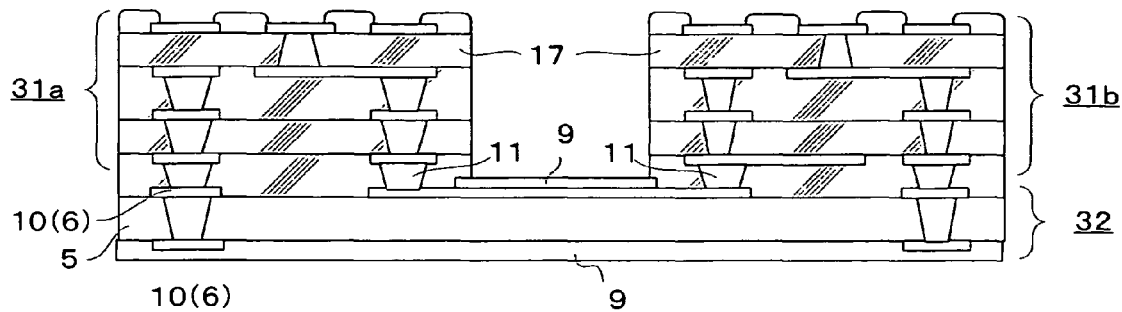
FIG. 42 is a cross sectional view schematically illustrating a state where unit rigid boards and a unit flexible board are connected with one another by conductive bumps formed on the unit rigid boards (in this case, the unit flexible boards are interlayer-connected with the conductive bumps at the two-sided plates).
Figure 43:
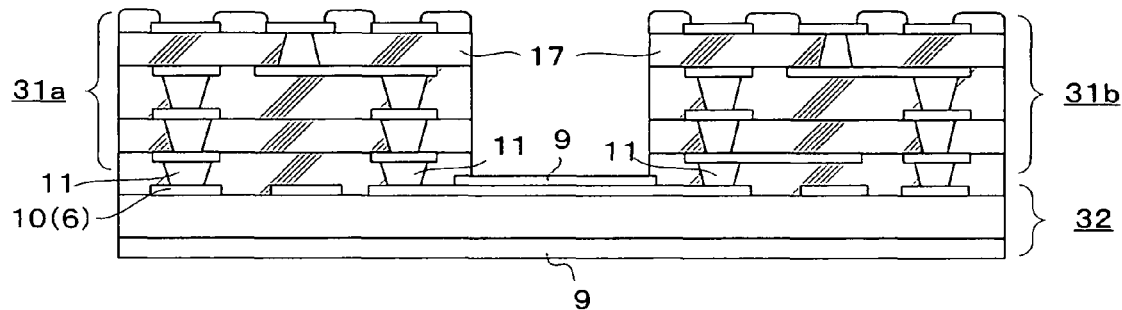
FIG. 43 is a cross sectional view schematically illustrating a state where unit rigid boards and an elongated unit flexible board are connected with one another with conductive bumps formed on the unit rigid boards (in this case, the unit flexible board is interlayer-connected with the conductive bumps at the two-sided plates).

The number in circuit layer of the rigid board is not restricted, and the interlayer connection can be carried out by any kind of means. However, the interlayer connection in the rigid board is carried out before the rigid board is connected with the flexible board. The flexible board 32 may be formed in a two-sided shape or one-sided shape, but at least one circuit layer is required to be formed on the flexible board 32. The two-sided flexible board can have a larger circuit area than the one-sided flexible board. In contrast, the one-sided flexible board can have smaller circuit area, but can not conduct the through hole processing so that the bending strength and the processing cost can be reduced. The two-sided flexible board can conduct the interlayer connection with the through holes as illustrated in FIGS. 37-40. In this case, the through holes are formed so as to penetrate through the flexible board in the thickness direction, and the inner walls of the through holes are covered with the conductive plating. As illustrated in FIG. 41, the interlayer connection of the flexible board 32 can be carried out by means of the laser via holes 33. Moreover, as illustrated in FIG. 42, the interlayer connection of the flexible board 32 can be carried out by means of the conductive bumps in accordance with the $B^2$it forming method. The laser via hole means a hole which includes a conductive plating on the inner wall thereof and which is formed by means of the irradiation of laser beam for the flexible board 32. In this way, the interlayer connection of the flexible board 32 may be conducted by any kind of means. FIG. 43 shows the rigid-flexible board using the one-sided flexible board. As is apparent from FIG. 43, the interlayer connection is not required for the rigid-flexible board using the one-sided flexible board.

Figure 44:
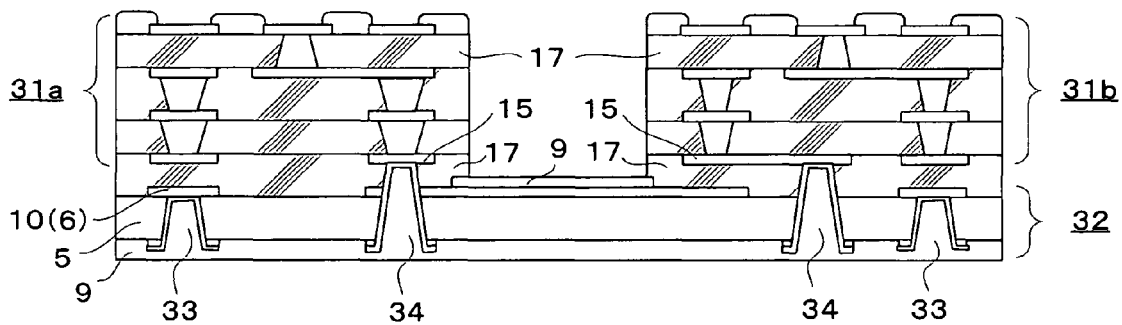
FIG. 44 is a cross sectional view schematically illustrating a state where unit rigid boards and an elongated unit flexible board are connected with one another with conductive bumps formed on the unit rigid boards (in this case, the unit flexible board is interlayer-connected with laser via holes at the two-sided plates).

In this embodiment relating to FIGS. 37-43, the electric connection between the horizontal circuit areas of the rigid board and the vertical circuit areas of the flexible board is carried out by means of the conductive bumps in accordance with the $B^2$it forming method, but may be done by means of the laser skip vias 34 as illustrated in FIG. 44. The laser skip via means a via which includes a conductive plating on the inner wall thereof and which is formed by means of the irradiation of laser beam for the flexible board 32 and the insulating layer 17 hardened from the glass-epoxy based prepreg. In the case of electrically connecting the rigid board and the flexible board with the laser skip vias 34, the interlayer connection of the flexible board and the electrical connection between the rigid board and the flexible board can be carried out almost simultaneously when the flexible board is the two-sided circuit plate under the condition of no interlayer connection. As a result, the connecting process can be simplified.

In the case of electrically connecting the rigid board and the flexible board with the laser skip vias 34, the one-sided circuit plate may be employed as the flexible board. In this case, however, the circuit surface of the plate may be faced to the outside against the rigid board so that various parts may be mounted on the flexible board (not shown). In any way, the laser skip via 34 can be formed by irradiating the laser beam to be used in micro-process for the flexible board 32 and the insulating layer 17 to form the through hole and applying the conductive plating on the inner wall of the through hole. Then, the circuit areas of the flexible board can be electrically connected to the circuit areas of the rigid board.

Figure 45:
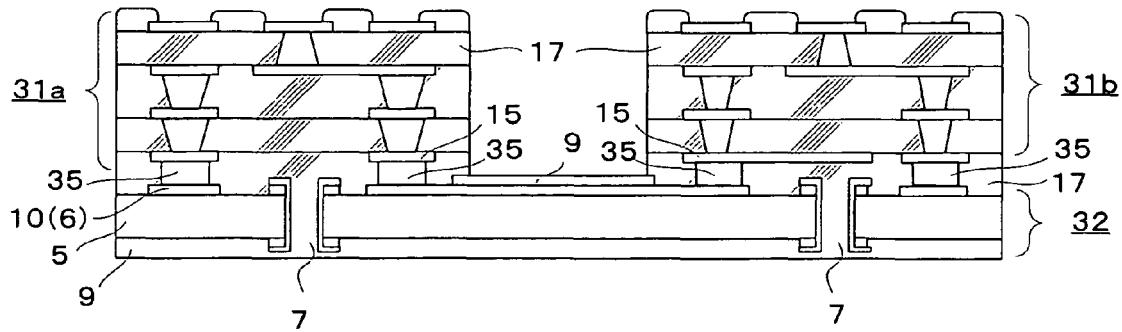
FIG. 45 is a cross sectional view schematically illustrating a state where unit rigid boards and an elongated unit flexible board are connected with one another with vertical circuit areas which is made of conductive paste in another embodiment.

The electrical connection between the horizontal circuit areas of the rigid board and the horizontal circuit areas of the flexible board can be carried out by another method using the conductive paste. First of all, a thermal melting resin layer is coated tentatively over the horizontal circuit areas of either of the rigid board and the flexible board. Then, the laser beam is irradiated onto the thermal melting resin layer so as to form the through hole to expose the horizontal circuit areas. Then, a conductive paste is filled in the through holes by means of screen printing. Then, the board formed as described above is aligned for and thermally pressed against another board. The conductive paste constitutes the vertical circuit areas in the thus obtained rigid-flexible board. According to the above-described method, the rigid-flexible board where the horizontal circuit areas of the rigid board can be electrically and mechanically connected to the horizontal circuit areas of the flexible board as illustrated in FIG. 45.

Figure 46:
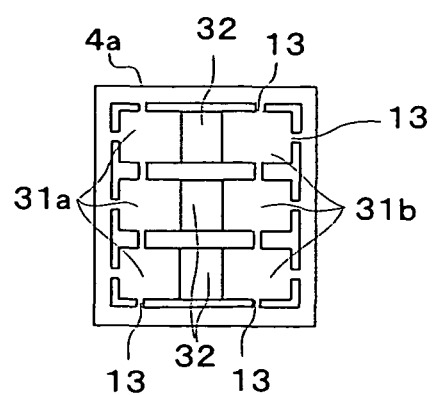
FIG. 46 is a plan view illustrating a state wherein unit rigid boards and flexile unit boards are arranged in a frame.
Figure 47:
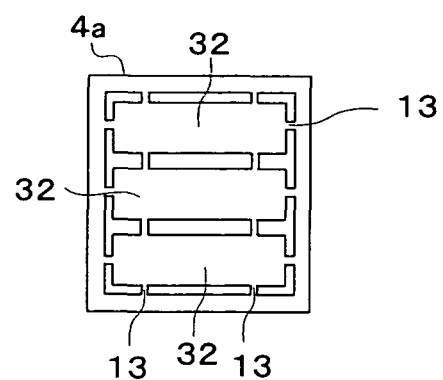
FIG. 47 is a plan view illustrating a state wherein the unit rigid boards and the flexile unit boards are arranged in the frame, as viewed from the opposite side of FIG. 46.

FIG. 46 is a plan view schematically illustrating the unit sheet for package wherein three rigid-flexible boards as illustrated in FIGS. 34, 36, 40-45 are arranged in the frame 4. FIG. 47 is a plan view illustrating the unit sheet, as viewed from the opposite side of FIG. 46 (from the flexible board side). As illustrated in FIGS. 46 and 47, in this embodiment, the flexible boards constitute the outer layers so as to cover the rigid boards.

In this embodiment, since the flexible boards constitute the outer layers so as to cover the rigid boards, the flexibility of the flexible boards can not be utilized. However, since the rigid-flexible board can be rendered plane without any step at the connecting areas of the rigid boards, the rigid-flexible board can be made by means of a well known and simple machine.

In the above-descried embodiment wherein the flexible boards constitute the outer layers so as to cover the rigid boards, the rigid boards can be laminated and fixed with the flexible boards as follows. (1) The rigid boards and the flexible boards are laminated as assembled panels. (2) The rigid boards are formed as an assembled panel and the flexible boards are divided into pieces so that the pieces are applied onto the assembled panel. (3) The rigid boards and the flexible boards are divided into pieces which are to be aligned in respective frames. (4) The rigid boards are divided into pieces and the flexible boards are formed as an assembled panel so that the pieces are applied onto the assembled panel. In the use of (1), the material efficiency can not be enhanced in comparison with a conventional technique, but can be carried out by means of a conventional machine. In the use of (2), the material efficiency for the flexible boards can be enhanced. In the use of (3), the material efficiency for both of the flexible boards and the rigid boards can be enhanced. In the use of (4), the material efficiency for the rigid boards can be enhanced.

In FIGS. 34-45, the reference numeral "9" designates a protective film which is to be used in various embodiments. In the case that the electrical connection is carried out using the conductive bumps in accordance with the $B^2$it forming method when some parts are not mounted on the flexible boards constituting the outer layers, (1) the rigid board can be laminated with the flexible boards via the insulating layers, not the protective film. (2) The rigid board can be laminated with the flexible boards via the insulating layers so as to sandwich a portion of the protective film. (3) The rigid board can be laminated with the flexible boards via the insulating layers so as to sandwich the photosensitive protective film. In the case that the electrical connection is carried out using the laser skip vias or the through holes, (4) The rigid board can be laminated with the flexible boards via the insulating layers so as to sandwich the protective film. In the case that some parts are mounted on the flexible boards constituting the outer layers, (5) the outer layers for the flexible boards can be made of the photosensitive protective films. Then, (6) the outer layers for the flexible boards can be made of the photosensitive protective films and the protective films.

In these embodiments, the unit sheets for package are arranged in the frame in planer matrix shape, but the arrangement of the unit sheets is not restricted. For example, only one unit sheet may be arranged in the frame.

As described above, according to the present invention, since the unit boards are formed and aligned in frames to form the unit board assembled panels which are laminated with one another, if one assembled panel is failed, the laminated body from the unit board assembled panels can not be failed by removing the failed assembled panel. In this point of view, the productivity yield can be enhanced. In the case of forming a complex board from the unit rigid boards and the unit flexible boards, particularly the productively yield for the unit flexible boards can be enhanced so that the manufacturing cost can be reduced remarkably.

What is claimed is:

1. A rigid-flexible board wherein a rigid board and a flexible board are laminated integrally via an insulating layer so that a vertical circuit area penetrating through said insulating layer can connect electrically a horizontal circuit areas area of said rigid board and a horizontal circuit area of said flexible board, wherein: said rigid board is a multilayered circuit rigid board with three or more circuit layers; said vertical circuit area is a conductive bump which is positioned at said horizontal circuit area of said flexible board and which is pressed against said horizontal circuit area of said rigid board so that the forefront of said conductive bump is plastic-deformed through said insulating layer; and said flexible board comprises a protective film covering said horizontal circuit area of said flexible board, said protective film having a first portion embedded in said insulating layer and a second portion exposed from said insulating layer, edges of said protective film being disposed within a range defined by edges of said horizontal circuit area of said flexible board; and wherein the protective film is in contact with said horizontal circuit area of said flexible board.

2. The rigid-flexible board according to claim 1, wherein said flexible board is a two-sided circuit plate with circuit layers on both main surfaces thereof so that said circuit layers are electrically connected with a through hole, a laser beam via hole or a conductive bump.

3. The rigid-flexible board according to claim 1, wherein said circuit layers of said multilayered circuit rigid board are electrically connected with one another by means of a conductive bump penetrating through at least one interlayer insulating layer.

4. A rigid-flexible board wherein a rigid board and a flexible board are laminated integrally via an insulating layer so that a vertical circuit area penetrating through said insulating layer can connect electrically a horizontal circuit areas area of said rigid board and a horizontal circuit area of said flexible board, wherein: said rigid board is a multilayered circuit rigid board with three or more circuit layers; said vertical circuit area is a laser skip via including a hole formed by means of the irradiation of laser beam onto said flexible board and said insulating layer so that a horizontal circuit area of said rigid board is exposed, a conductive layer being applied onto the inner wall of said hole; and said flexible board comprises a protective film covering said horizontal circuit area of said flexible board, said protective film having a first portion embedded in said insulating layer and a second portion exposed from said insulating layer, edges of said protective film being disposed within a range defined by edges of said horizontal circuit area of said flexible board; and wherein said protective film is in contact with said horizontal circuit area of said flexible board.

5. A rigid-flexible board wherein a rigid board and a flexible board are laminated integrally via an insulating layer so that a vertical circuit area penetrating through said insulating layer can connect electrically a horizontal circuit areas area of said rigid board and a horizontal circuit area of said flexible board, wherein: said rigid board is a multilayered circuit rigid board with three or more circuit layers; said vertical circuit area comprises a through hole which is formed at said insulating layer commensurate with said horizontal circuit areas area of said rigid board and said horizontal circuit area of said flexible board and a conductive material filled in said through hole; said flexible board comprises a protective film covering said horizontal circuit area of said flexible board, said protective film having a first portion embedded in said insulating layer and a second portion exposed from said insulating layer, edges of said protective film being disposed within a range defined by edges of said horizontal circuit area said flexible board; and said flexible board is exposed to an outer layer; and wherein said protective film is in contact with said horizontal circuit area of said flexible board.

6. The rigid-flexible board according to any one of claims 1-4 and 5, wherein said flexible board covers either main surface of said rigid board entirely.

* * * * *

UNITED STATES PATENT AND TRADEMARK OFFICE
CERTIFICATE OF CORRECTION

PATENT NO. : 8,592,686 B2  
APPLICATION NO. : 11/547715  
DATED : November 26, 2013  
INVENTOR(S) : Atsushi Kobayashi et al.

Page 1 of 1

It is certified that error appears in the above-identified patent and that said Letters Patent is hereby corrected as shown below:

In the Claims

Claim 1, Col. 15, Line 8, "areas area" should read as --area--.

Claim 4, Col. 15, Line 38, "areas area" should read as --area--.

Claim 5, Col. 16, Line 19, "areas area" should read as --area--.

Claim 5, Col. 16, Line 32, "area said" should read as --area of said--.

Signed and Sealed this  
Seventh Day of October, 2014

Michelle K. Lee  
*Deputy Director of the United States Patent and Trademark Office*

UNITED STATES PATENT AND TRADEMARK OFFICE
CERTIFICATE OF CORRECTION

PATENT NO.        : 8,592,686 B2                                                                        Page 1 of 1
APPLICATION NO. : 11/547715
DATED             : November 26, 2013
INVENTOR(S)       : Kobayashi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1710 days.

Signed and Sealed this
Twenty-second Day of September, 2015

Michelle K. Lee
*Director of the United States Patent and Trademark Office*